US012136455B2

(12) United States Patent
Rao

(10) Patent No.: US 12,136,455 B2
(45) Date of Patent: *Nov. 5, 2024

(54) LIFETIME MIXED LEVEL NON-VOLATILE MEMORY SYSTEM

(71) Applicant: Vervain, LLC, Dallas, TX (US)

(72) Inventor: G. R. Mohan Rao, Allen, TX (US)

(73) Assignee: Vervain, LLC, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/613,301

(22) Filed: Mar. 22, 2024

(65) Prior Publication Data

US 2024/0233816 A1    Jul. 11, 2024

Related U.S. Application Data

(60) Continuation of application No. 18/387,546, filed on Nov. 7, 2023, now Pat. No. 11,967,369, which is a
(Continued)

(51) Int. Cl.
*G11C 11/56* (2006.01)
*G06F 11/10* (2006.01)
(Continued)

(52) U.S. Cl.
CPC ...... *G11C 11/5635* (2013.01); *G06F 11/1068* (2013.01); *G06F 11/1072* (2013.01);
(Continued)

(58) Field of Classification Search
CPC ............ G11C 11/5635; G11C 11/5621; G11C 11/5678; G11C 16/16; G11C 16/3495;
(Continued)

(56) References Cited

U.S. PATENT DOCUMENTS 5,936,971 A    8/1999   Harari et al.
6,901,498 B2   5/2005   Conley
(Continued)

FOREIGN PATENT DOCUMENTS

CN    101739312 A    6/2010
EP      2291746 A2   3/2011
WO    03027828 A1    4/2003

OTHER PUBLICATIONS

U.S. Appl. No. 18/613,466; all pages (Year: 2024).*
(Continued)

*Primary Examiner* — Fernando Hidalgo

(57) ABSTRACT

A flash controller for managing at least one MLC non-volatile memory module and at least one SLC non-volatile memory module. The flash controller is adapted to determine if a range of addresses listed by an entry and mapped to said at least one MLC non-volatile memory module fails a data integrity test. In the event of such a failure, the controller remaps said entry to an equivalent range of addresses of said at least one SLC non-volatile memory module. The flash controller is further adapted to determine which of the blocks in the MLC and SLC non-volatile memory modules are accessed most frequently and allocating those blocks that receive frequent writes to the SLC non-volatile memory module and those blocks that receive infrequent writes to the MLC non-volatile memory module.

14 Claims, 5 Drawing Sheets

Related U.S. Application Data continuation of application No. 17/203,385, filed on Mar. 16, 2021, now Pat. No. 11,830,546, which is a continuation of application No. 16/006,299, filed on Jun. 12, 2018, now Pat. No. 10,950,300, which is a continuation of application No. 14/950,553, filed on Nov. 24, 2015, now Pat. No. 9,997,240, which is a continuation of application No. 14/525,411, filed on Oct. 28, 2014, now Pat. No. 9,196,385, which is a division of application No. 13/455,267, filed on Apr. 25, 2012, now Pat. No. 8,891,298.

(60) Provisional application No. 61/509,257, filed on Jul. 19, 2011.

(51) Int. Cl.
| | | |
|---|---|---|
| G06F 12/02 | (2006.01) | |
| G11C 16/16 | (2006.01) | |
| G11C 16/34 | (2006.01) | |
| G11C 29/00 | (2006.01) | |
| G11C 29/52 | (2006.01) | |

(52) U.S. Cl.
CPC ...... *G06F 12/0246* (2013.01); *G11C 11/5621* (2013.01); *G11C 11/5678* (2013.01); *G11C 16/16* (2013.01); *G11C 16/3495* (2013.01); *G11C 29/52* (2013.01); *G11C 29/76* (2013.01); *G06F 2212/7202* (2013.01); *G11C 2211/5641* (2013.01)

(58) Field of Classification Search
CPC . G11C 29/52; G11C 29/76; G11C 2211/5641; G06F 11/1068; G06F 11/1072; G06F 12/0246; G06F 2212/7202
USPC ................................................. 365/185.03
See application file for complete search history.

(56) References Cited

U.S. PATENT DOCUMENTS

| | | | |
|---|---|---|---|
| 7,000,063 B2 | 2/2006 | Friedman et al. | |
| 7,254,059 B2 | 8/2007 | Li et al. | |
| 7,366,826 B2 | 4/2008 | Gorobets et al. | |
| 7,453,712 B2 | 11/2008 | Kim et al. | |
| 7,505,338 B2 | 3/2009 | Lee | |
| 7,653,779 B1 | 1/2010 | Fein et al. | |
| 7,733,729 B2 | 6/2010 | Boeve | |
| 7,853,749 B2 | 12/2010 | Kolokowsky | |
| 7,855,916 B2 | 12/2010 | Rao | |
| 8,010,873 B2 | 8/2011 | Kirschner et al. | |
| 8,078,794 B2 | 12/2011 | Lee et al. | |
| 8,120,960 B2 | 2/2012 | Varkony | |
| 8,140,800 B2 | 3/2012 | Miyachi et al. | |
| 8,250,333 B2 | 8/2012 | Gorobets et al. | |
| 8,356,152 B2 | 1/2013 | You | |
| 8,656,256 B2 | 2/2014 | Weathers et al. | |
| 8,825,941 B2 | 9/2014 | Moshayedi et al. | |
| 8,891,298 B2* | 11/2014 | Rao ........................ | G11C 29/52 365/158 |
| 9,196,385 B2* | 11/2015 | Rao ..................... | G11C 11/5678 |
| 9,972,240 B2* | 5/2018 | Hsu ...................... | G09G 3/2011 |
| 9,997,240 B2 | 6/2018 | Rao | |
| 10,950,300 B2* | 3/2021 | Rao ..................... | G11C 11/5678 |
| 11,967,370 B1* | 4/2024 | Rao ..................... | G06F 11/1072 |
| 2005/0251617 A1 | 11/2005 | Sinclair et al. | |
| 2006/0053246 A1 | 3/2006 | Lee | |
| 2007/0276988 A1* | 11/2007 | Luo ..................... | G06F 12/0246 711/103 |
| 2008/0082736 A1 | 4/2008 | Chow et al. | |
| 2008/0140918 A1 | 6/2008 | Sutardja | |
| 2009/0268513 A1 | 10/2009 | Ambroggi et al. | |
| 2009/0300269 A1 | 12/2009 | Radke et al. | |
| 2009/0307418 A1 | 12/2009 | Chen et al. | |
| 2009/0327591 A1 | 12/2009 | Moshayedi | |
| 2010/0017650 A1 | 1/2010 | Chin et al. | |
| 2010/0058018 A1 | 3/2010 | Kund et al. | |
| 2010/0115192 A1 | 5/2010 | Lee | |
| 2010/0172179 A1 | 7/2010 | Gorobets et al. | |
| 2010/0172180 A1 | 7/2010 | Paley et al. | |
| 2010/0318879 A1 | 12/2010 | Yu | |
| 2010/0325352 A1 | 12/2010 | Schuette et al. | |
| 2011/0050870 A1 | 3/2011 | Hanari | |
| 2011/0060870 A1 | 3/2011 | Rao | |
| 2011/0096601 A1 | 4/2011 | Gavens et al. | |
| 2011/0099460 A1 | 4/2011 | Dusija et al. | |
| 2011/0271043 A1 | 11/2011 | Segal et al. | |
| 2011/0302364 A1 | 12/2011 | Yeh et al. | |
| 2012/0311244 A1 | 12/2012 | Huang et al. | |
| 2015/0214476 A1 | 7/2015 | Matsui et al. | |

OTHER PUBLICATIONS

IPR2021-01547 Patent Owner's Sur Reply.
IPR2021-01547 Petitioner's Motion to File Confidential Document Under Seal.
IPR2021-01547 Petitioner's Notice of Deposition of Dr. Sunil P. Khatri.
IPR2021-01547 Petitioner's Notice of Filing Demonstrative Exhibits.
IPR2021-01547 Petitioner's Reply.
IPR2021-01547 Petitioner's Request for Oral Argument.
IPR2021-01547 Termination Due to Settlement After Institution of Trial.
Ipr2021-01547, 01548 Exhibit 1061 U.S. Pat. No. 8,130,554 Linnell.
Ipr2021-01547, 01548 Exhibit 1062 U.S. Pat. No. 7,917,709 Gorobets.
Ipr2021-01547, 01548 Exhibit 1069 Micron's Hearing Demonstratives.
Ipr2021-01547, 01548 Exhibit 3002 Default Protective Order.
IPR2021-01547, 01548, 01549 Exhibit 1059 Deposition of Sunil P. Khatri, Ph.D.
IPR2021-01547, 01548, 01549 Exhibit 1064 A Hybrid Flash Memory SSD Scheme.
IPR2021-01547, 01548, 01549 Exhibit 1065 IEEE Transactions on Computers: Improving Flash Wear-Leveling by Proactively Moving Static Data.
IPR2021-01547, 01548, 01549 Exhibit 1066 Rejuvenator: A Static Wear Leveling Algorithm for NAND Flash Memory with Minimized Overhead.
IPR2021-01547, 01548, 01549 Exhibit 2020 Remote Deposition of Dr. David Liu.
IPR2021-01547, 01548, 01549, 01550 Exhibit 2022 Patent Owner's Demonstratives.
IPR2021-01547, 01548, 01549, 01550 Hearing Transcript.
IPR2021-01547, 01548, 01549, 01550 Panel change Order, Conduct of Proceedings.
IPR2021-01547, 01548, 01549, 01550 Record of Oral Hearing.
IPR2021-01547, 01548, 01549; 01550 Exhibit 1058 CV of David Huan-Yu Lin Ph.D.
IPR2021-01547, IPR2021-01548—Exhibit 1002—File History of U.S. Pat. No. 8,891,298.
IPR2021-01548—Exhibit 1004—File History of U.S. Pat. No. 9,196,385.
IPR2021-01548—Exhibit 1009—Declaration of Dr. David Liu ("Liu Decl.").
IPR2021-01548—Exhibit 2012 Claim Construction Order.
IPR2021-01548—Petition for Inter Partes Review of U.S. Pat. No. 9,196,385; filed Sep. 21, 2021.
IPR2021-01548—Petition's Power of Attorney.
IPR2021-01548 Decision Granting Institution of Inter Partes Review.
IPR2021-01548 Exhibit 2004: U.S. Pat. No. 10,950,3000 Rao.
IPR2021-01548 Exhibit 2009: Invalidity Claim Chart for the '385 Patent (Dusija).
IPR2021-01548 Exhibit 2010: Invalidity Claim Chart for the '385 Patent (Saturdja).

(56) References Cited

OTHER PUBLICATIONS

IPR2021-01548 Exhibit 2011: Invalidity Claim Chart for the '385 Patent (Moshayedi).
IPR2021-01548 Exhibit 2014 Declaration of Sunil P. Khatri.
IPR2021-01548 Exhibit 2015 Remote Deposition of Dr. David Liu.
IPR2021-01548 Exhibit 2016 U.S. Pat. No. 8,285,940 Reid.
IPR2021-01548 Exhibit Default Protective Order.
IPR2021-01548 Patent Owner's Motion to File Sur-Reply Under Seal.
IPR2021-01548 Patent Owner's Notice of Deposition of Dr. David Liu.
IPR2021-01548 Patent Owner's Preliminary Response.
IPR2021-01548 Patent Owner's Request for Oral Argument.
IPR2021-01548 Patent Owner's Response.
IPR2021-01548 Patent Owner's Sur-Reply.
IPR2021-01548 Petitioner's Motion to File Confidential Document Under Seal.
IPR2021-01548 Petitioner's Notice of Deposition of Dr. Sunil P. Khatri.
IPR2021-01548 Petitioner's Reply.
IPR2021-01548 Petitioner's Request for Oral Argument.
IPR2021-01548 Reply Declaration of Dr. David Liu.
IPR2021-01548 Termination Due to Settlement After Institution of Trial.
IPR2021-01549—Exhibit 1006—File History of U.S. Pat. No. 9,997,240.
IPR2021-01549—Exhibit 1009—Declaration of Dr. David Liu ("Liu Decl.").
Abhishek Rajimwale et al., Block Management in Solid-State Devices, Usenix Conference, Jun. 14-19, 2009.
Abul Rub Aamer Mohammed, Improving Hot Data Identification for Hybrid SLC/MLC Device; CSci 8980-Advanced Storage Systems, Spring 2009.
Agreed Scheduling Order, dated Sep. 16, 2021, in *Vervain, LLC* v. *Micron Technology, Inc., Micron Semiconductor Products, Inc., and Micron Technology Texas, LLC*, Case No. 6:21-cv-00487-ADA.
Anand Lal Shimpi, AnandTech, The Crucial m4 (Micron C400) SSD Review, Mar. 31, 2011.
Anand Lal Shimpi, AnandTech, The Intel SSD 320 Review: 25nm G3 is Finally Here, Mar. 28, 2011.
Ashok Sharma, Advanced Semiconductor Memories, Architectures, Designs, and Applications (2003) ("Sharma").
Bacchini et al., Characterization of Data Retention Faults in DRAM Devices, Nov. 2014.
Betty Prince, Semiconductor Memories—A Handbook of Design, Manufacture, and Application (2d ed. 1991) ("Prince").
Bhati et al., DRAM Refresh Mechanisms, Penalties, and Trade-Offs, IEEE Transactions on Computers, vol. 64, No. X, 2015.
Brendan Gregg et al, Sun Storage 7000 Unified Storage System L2ARC: Second Level Adaptive Replacement Cache, Oracle White Paper—Sun Storage 7000 Unified Storage System L2ARC, May 2010.
Brian Dipert and Markus Levy, Designing with Flash Memory (1994) ("Dipert & Levy").
Cho et al., An Innovative Indicator to Evaluate DRAM Cell Transistor Leakage Current Distribution; Journal of Electron Devices Society, vol. 6, Apr. 26, 2018.
Chris Evans, Consultant with Langton Blue, SearchStorage.co.UK, Enterprise MLC; How flash vednors are boosting MLC write endurance, Jun. 3, 2011.
Chunqiang Tang, FVD: a High-Performance Virtual Machine Image Format for Cloud, USENIX Conference, Jun. 2011.
Clinton W. Smullen, IV et al.,Accelerating Enterprise Sold-State Disks with Non-Volatile Merge Caching, 2010 International Green Computing Conference, Aug. 15-18, 2010.
Complaint for Patent Infringement, *Vervain, LLC* v. *Micron Technology, Inc., Micron Semiconductor Products, Inc., and Micron Technology Texas, LLC*, Case No. 6:21-cv-00487-ADA (May 10, 2021 W.D. Tex.).

Dani Kass, Judge Albright Now Oversees 20% of New U.S. Patent Cases, Law360.
Doug Rollins, SSD Enhancements: Protecting Data Integrity and Improving Responsiveness, Industry Perspectives, Jul. 30, 2014.
Douglas J. Lee et al., Control Logic and Cell Desing for a 4K NVRAM, IEEE Journal of Sold-State Circuits, vol. SC-18, No. 5, Oct. 1983.
Duane H. Oto et al., High-Voltage Regulation and Process Considerations for High-Density 5 V-Only E2PROM's, IEEE Journal of Sold-State Circuits, vol. _ SC-18, No. 5, Oct. 1983.
Ethan Chen; Tones Yen; Advantech: Ultra MLC Technology Introduction; Oct. 5, 2012, 10 pages.
Frank Hargrave; Hargrave's Communications Dictionary excerpt; IEEE Press Marketing; 2001; ISBN 0-7803-6020-6; 9 pages.
Frank Shu, The Myth of SSD Testing, Flash Memory Summit 2011, Santa Clara, CA.
Garth Goodson et al., Design Tradeoffs in a Flash Translation Layer, HPCA West 2010 (High Pert Comp Arch Conference, Bangalore, India.
Gheorghe Samachisa et al., A 128K Flash EEPROM Using Double-Polysilicon Technology, IEEE Journal of Sold-State Circuits, vol. _ SC-18, No. 5, Oct. 1983.
Greg Atwood et al., Intel Strata Flash TM Memory Technology Overview, Intel Technology Journal Q4 1997.
Hamamoto et al., On the Retention Time Distribution of Dynamic Random Access Memory (DRAM), IEEE Transactions on Electron Devices, vol. 45, No. 6, Jun. 1998.
Hynix, 32Gb NAND Flash, HY27UK08BGFM, Product Description Sheet, Feb. 2007.
Intel, Understanding the Flash Translation Layer (FTL) Specification, Dec. 1998.
IPR2021_01547 Motion to File Confidential Document Under Seal.
IPR2021-01547—Exhibit 1009—Declaration of Dr. David Liu ("Liu Decl.").
IPR2021-01547—Petition for Inter Partes Review of U.S. Pat. No. 8,891,298; filed Sep. 21, 2021.
IPR2021-01547—Petition's Power of Attorney.
IPR2021-01547 Decision Granting Institution of Inter Partes Review.
IPR2021-01547 Exhibit 1057 Reply Declaration of Dr. David Liu.
IPR2021-01547 Exhibit 2001: Declaration of Sunil P. Khatri.
IPR2021-01547 Exhibit 2009: Invalidity Claim Chart for the '298 Patent (Dusija).
IPR2021-01547 Exhibit 2010: Invalidity Claim Chart for the '298 Patent (Saturdja).
IPR2021-01547 Exhibit 2011: Invalidity Claim Chart for the '298 Patent (Moshayedi).
IPR2021-01547 Exhibit 2012 Claim Construction Order.
IPR2021-01547 Exhibit 2014 Declaration of Sunil P. Khatri.
IPR2021-01547 Exhibit 2015 Remote Deposition of Dr. David Liu.
IPR2021-01547 Exhibit 2016 U.S. Pat. No. 8,285,940 Reid.
IPR2021-01547 Order on Motion to Seal.
IPR2021-01547 Patent Owner's Corrected Preliminary Response.
IPR2021-01547 Patent Owner's Motion to File Sur-Reply Under Seal.
IPR2021-01547 Patent Owner's Notice of Deposition of Dr. David Liu.
IPR2021-01547 Patent Owner's Request for Oral Argument.
IPR2021-01547 Patent Owner's Response.
IPR2021-01549—Exhibit 1055—New Oxford American Dictionary, 3rd Edition, 2010, definitions of frequency and threshold.
IPR2021-01549—Petition for Inter Partes Review of U.S. Pat. No. 9,997,240; filed Oct. 13, 2021.
IPR2021-01549—Petition's Power of Attorney.
IPR2021-01549 Decision Granting Institution of Inter Partes Review.
IPR2021-01549 Exhibit 1057 Reply Declaration of Dr. David Liu.
IPR2021-01549 Exhibit 1067 Vervain's Sur-Reply Claim Construction Brief.
IPR2021-01549 Exhibit 1070 Micron's Hearing Demonstratives.
IPR2021-01549 Exhibit 2009: Invalidity Claim Chart for the '240 Patent (Dusija).
IPR2021-01549 Exhibit 2010: Invalidity Claim Chart for the '240 Patent (Saturdja).
IPR2021-01549 Exhibit 2014 Declaration of Sunil P. Khatri.

(56) References Cited

OTHER PUBLICATIONS

IPR2021-01549 Exhibit 2015 Remote Deposition of Dr. David Liu.
IPR2021-01549 Exhibit 2016 U.S. Pat. No. 8,285,940 Reid.
IPR2021-01549 Patent Owner's Notice of Deposition of Dr. David Liu.
IPR2021-01549 Patent Owner's Preliminary Response.
IPR2021-01549 Patent Owner's Request for Oral Argument.
IPR2021-01549 Patent Owner's Response.
IPR2021-01549 Patent Owner's Sur-Reply.
IPR2021-01549 Petitioner's Notice of Deposition of Dr. Sunil P. Khatri.
IPR2021-01549 Petitioner's Reply.
IPR2021-01549 Petitioner's Request for Oral Argument.
IPR2021-01549 Termination Due to Settlement After Institution of Trial.
IPR2021-01550—Exhibit 1008—File History of U.S. Pat. No. 10,950,300.
IPR2021-01550—Exhibit 1009—Declaration of Dr. David Liu ("Liu Decl.").
IPR2021-01550—Petition for Inter Partes Review of U.S. Pat. No. 10,950,300; filed Sep. 21, 2021.
IPR2021-01550—Petition's Power of Attorney.
IPR2021-01550 Decision Granting Institution of Inter Partes Review.
IPR2021-01550 Exhibit 1057 Reply Declaration of Dr. David Liu.
IPR2021-01550 Exhibit 1060 Deposition of Sunil P. Khatri, Ph.D.
IPR2021-01550 Exhibit 1068 U.S. Pat. No. 8,010,873 Kirschner.
IPR2021-01550 Exhibit 1071 Micron's Hearing Demonstratives.
IPR2021-01550 Exhibit 2002: Ethan Chen; Tones Yen; Advantech: Ultra MLC Technology Introduction; Oct. 5, 2012, 10 pages.
IPR2021-01550 Exhibit 2003 Rino Micheloni, Luna Crippa, Alessia Marelli; Springer: Inside NAND Flash Memories; 2010; ISBN 978-90-481-9430-8; 12 pages.
IPR2021-01550 Exhibit 2005: Microsoft Computer Dictionary Fifth Edition; Definition for Data Integrity; 2002, ISBN 0-7356-1495-4.
IPR2021-01550 Exhibit 2006: Frank Hargrave; Hargrave's Communications Dictionary excerpt; IEEE Press Marketing; 2001; ISBN 0-7803-6020-6; 9 pages.
IPR2021-01550 Exhibit 2007: Law360 Article.
IPR2021-01550 Exhibit 2009: Invalidity Claim Chart for the '300 Patent (Dusija).
IPR2021-01550 Exhibit 2010: Invalidity Claim Chart for the '300 Patent (Saturdja).
IPR2021-01550 Exhibit 2012 Claim Construction Order.
IPR2021-01550 Exhibit 2013: Micron's Preliminary Invalidity Contentions.
IPR2021-01550 Exhibit 2014 Declaration of Sunil P. Khatri.
IPR2021-01550 Exhibit 2015 Remote Deposition of Dr. David Liu.
IPR2021-01550 Exhibit 2017 U.S. Pat. No. 5,721,862 Sartore et al.
IPR2021-01550 Exhibit 2019 U.S. Pat. No. 5,535,399 Blitz et al.
IPR2021-01550 Exhibit 2020 Remote Deposition of Dr. David Liu.
IPR2021-01550 Patent Owner's Corrected Preliminary Response.
IPR2021-01550 Patent Owner's Notice of Deposition of Dr. David Liu.
IPR2021-01550 Patent Owner's Request for Oral Argument.
IPR2021-01550 Patent Owner's Response.
IPR2021-01550 Patent Owner's Sur-Reply.
IPR2021-01550 Petitioner's Notice of Deposition of Dr. Sunil P. Khatri.
IPR2021-01550 Petitioner's Reply.
IPR2021-01550 Petitioner's Request for Oral Argument.
IPR2021-01550 Termination Due to Settlement After Institution of Trial.
Ismael Change Chalimi, Intalio, An Intalio White Paper, Cloud Computing is Memory Bound, May 2010.
James Myers, Data Integrity in Solid State Drives: What Supernovas Mean to You, IT Peer Network, Feb. 19, 2014.
Jan Axelson, USB Mass Storage: Designing and Programming Devices and Embedded Hosts (2006) ("Axelson").

Jesung Kim et al., A Space-Efficient Flash Translation Layer for Compact flash Systems, IEEE Transactions on Consumer Electronics, vol. 48, No. 2, May 2002.
Judge Albright, Order Governing Proceedings—Patent Cases (OGP 3.4).
Ken Takeuchi et al., A Multipage Cell Architecture for High-Speen Programming Multilevel NANO Flash Memories, IEEE Journal of Sold-State Circuits, vol. 33, No. 8, Aug. 1998.
Law360 Article.
Luo et al., WARM: Improving NANO Flash Memory Lifetime with Write-hotness Aware Retention Management, IEEE, 2015.
Masaki Momodomi et al., An Experimental 4-Mbit CMOS EEPROM with a NANO-Structured Cell, IEEE Journal of Sold-State Circuits, vol. _ 24, No. 5, Oct. 1989.
Masayoshi Ohkawa et al., A 98 mm 2 Die Size 3.3V 64-Mb Flash Memory with FN-NOR Type Four-Level Cell, IEEE Journal of Solid-State Circuits, vol. 31, No. 11, Nov. 1996.
Merriam-Webster's Collegiate Dictionary, Eleventh Edition, 2006, definition of periodic.
Micheloni et al., Architectural and Integration Options for 3D NANO Flash Memories, Computers 2017, 6, 27.
Micron Technology, Inc., TN-29-42: Wear-Leveling Techniques in NAND Flash Devices Introduction, Oct. 2008.
Micron's Preliminary Invalidity Contentions.
Microsoft Computer Dictionary Fifth Edition; Definition for Data Integrity; 2002, ISBN 0-7356-1495-4.
Microsoft Computer Dictionary, Fifth Edition, 2002, definition of read-after-write.
Moinunddin K. Qureshi et al., Morphable Memory System: A Robust Architecture for Exploiting Multi-Level Phase Change Memories, International Symposium on Computer Architecture, Saint-Malo, France, Jun. 19-23, 2010.
Monolithic 3D, Inc., introducing our monolithic 3D resistive memory architecture, http://www.monolithic3d.com/2/post/2011/06/introducing-our-3d-resistive-memory-architecture.html, Jun. 27, 2011.
Nelson Duann, Silicon Motion, Inc., Flash Memory Summit, SIC & MIC Hybrid, Santa Clara, CA, Aug. 2008.
New Oxford American Dictionary, 3rd Edition, 2010, definition of module.
Paolo Pavan et al., Flash Memory Cells—An Overview, Proceedings of the IEEE, vol. 85, No. 8, Aug. 1997.
Park et al., Three-Dimensional 128 GB MLC Vertical NAN □ Flash Memory With 24-WL Stacked Layers and 50 MB/s High-Speed Programming; IEEE Journal of Solid-State Circuits, vol. 50, No. 1, Jan. 2015.
Qingsing Wei et al., WAFTL: A Workload Adaptive Flash Translation Layer with Data Partition, IEEE 27th Symposium on Massive Storage Systems and Technologies (MSST), May 23-27, 2011.
Resnati, et al., Temperature Effects in NANO Flash Memories: A Comparison Between 2-D and 3-D Arrays; IEEE Electron Device Letters, vol. 38, No. 4, Apr. 2017.
Rino Micheloni et al., Inside NAND Flash Memories (1st ed. 2010) ("Micheloni").
Rino Micheloni, Luna Crippa, Alessia Marelli; Springer: Inside NAND Flash Memories; 2010; ISBN 978-90-481-9430-8; 12 pages.
Roberto Bez et al., Introduction to Flash Memory, Proceedings of the IEEE, vol. 91, No. 4, Apr. 2003.
Samsung Electronics Co., Ltd., 7th International Symposium on Advanced Gate Stack Technology, RPAM Technology from an Industrial Perspective, Process Development Team/RP AM PJT In-Gyu Baek, Sep. 2010.
Scott McKeown, "WDTX 'Implausible Schedule' & Cursory Markman Order Highlighted," Ropes & Gray, Patents Post-Grant, Inside Views & News Pertaining to the Nation's Busiest Patent Court.
Seagate Technology LLC, The Transition to Advanced Format 4K Sector Hard Drives, Apr. 2010.
Shigeru Atsumi et al., A Channel-Erasing 1.8-V-Only 32-mb NOR Flash EEPROM with a Bitline Direct Sening Scheme, IEEE Journal of Sold-State Circuits, vol. 35, No. 11, Nov. 2000.
Silicon Systems, Increasing Flash SSD Reliability, StorageSearch. com, Apr. 2005.

(56) References Cited

OTHER PUBLICATIONS

Simona Boboiia, et al., Write Endurance in Flash Drives: Measurements and Analysis, Handout at Usenix Conference On File and Storage Technologies, San Jose, CA, Feb. 2010.

Simona Boboiia, et al., Write Endurance in Flash Drives: Measurements and Analysis, Usenix Conference on File and Storage Technologies, San Jose, CA, Feb. 2010.

Song Jiang et al., S-FTL: An Efficient Address Translation for Flash Memory by Exploiting Spatial Locality, Proceedings of the MSST 2011, May 2011.

Taehee Cho et al., A Dual-Mode NAND Flash Memory: 1-GB Multilevel and High-Performance 512-Mb Single-Level Modes, IEEE Journal of Sold-State Circuits, vol. 36, No. 11, Nov. 2001.

Taeho Kgil et al., Improving NANO Flash Based Disk Caches, International Symposium on Computer Architecture, Copyright 2008 IEEE.

Tae-Sun Chung et al., A Survey of Flash Translation Layer, Journal of Systems Architecture 55, pp. 332-343, 2009.

Tae-Sung Jung et al., A 117-mm2 3.3-V Only 128-Mb Multilevel NANO Flash Memory for Mass Storage Applications, IEEE Journal of Solid-State Circuits, vol. 31, No. 11, Nov. 1996.

Vervain's Preliminary Infringement Contentions, dated Aug. 6, 2021, in *Vervain, LLC* v. *Micron Technology, Inc., Micron Semiconductor Products, Inc., and Micron Technology Texas, LLC*, Case No. 6:21-cv-00487-ADA.

Ynag Hu, Achieving Page-Mapping FTL Performance at Block-Mapping FTL Cost by Hiding Address Translation, 26th Elli Symposium on Massive Storage Systems and Technologies (MSST) May 3-7, 2010.

Yoshihisa Iwata et al., A High-Density NANO EEPROM with Block-Page Programming for Microcomputer Applications, IEEE Journal of Solid-State Circuits, vol. 25, No. 2, Apr. 1990.

Petition for Post-Grant Review of U.S. Pat. No. 11,830,546, PGR2024-00047, *Phison Electronics Corporation* v. *Vervain, LLC*, Aug. 27, 2024, 96 pages.

* cited by examiner

| LOGICAL ADDRESS RANGE | PHYSICAL ADDRESS RANGE |
|---|---|
| R0 | MLC/Block 0 |
| R1 | MLC/Block 1 |
| R2 | MLC/Block 2 |
| R3 | MLC/Block 3 |
| R4 | MLC/Block 4 |
| RN | MLC/Block N |

Failed Data Integrity Test → R2

FIG. 2A

| LOGICAL ADDRESS RANGE | PHYSICAL ADDRESS RANGE |
|---|---|
| R0 | MLC/Block 0 |
| R1 | MLC/Block 1 |
| R2 | SLC/Block 0 |
| R3 | MLC/Block 3 |
| R4 | MLC/Block 4 |
| RN | MLC/Block N |

Remapping to SLC flash module → R2

FIG. 2B

LIFETIME MIXED LEVEL NON-VOLATILE MEMORY SYSTEM

CROSS-REFERENCE TO RELATED APPLICATIONS

This application is a continuation of U.S. application Ser. No. 18/387,546, filed Nov. 7, 2023, entitled LIFETIME MIXED LEVEL NON-VOLATILE MEMORY SYSTEM, which is a continuation of U.S. application Ser. No. 17/203,385, filed Mar. 16, 2021, entitled LIFETIME MIXED LEVEL NON-VOLATILE MEMORY SYSTEM, which is a continuation of U.S. patent application Ser. No. 16/006,299, filed Jun. 12, 2018, entitled LIFETIME MIXED LEVEL NON-VOLATILE MEMORY SYSTEM, issued as U.S. Pat. No. 10,950,300 on Mar. 16, 2021, which is a continuation of U.S. patent application Ser. No. 14/950,553, filed Nov. 24, 2015, entitled LIFETIME MIXED LEVEL NON-VOLATILE MEMORY SYSTEM, issued as U.S. Pat. No. 9,997,240 on Jun. 12, 2018, which a continuation of U.S. patent application Ser. No. 14/525,411, filed Oct. 28, 2014, entitled LIFETIME MIXED LEVEL NON-VOLATILE MEMORY SYSTEM, issued as U.S. Pat. No. 9,196,385 on Nov. 24, 2015, which is a divisional of U.S. patent application Ser. No. 13/455,267, filed Apr. 25, 2012, LIFETIME MIXED LEVEL NON-VOLATILE MEMORY SYSTEM, issued as U.S. Pat. No. 8,891,298 on Nov. 18, 2014, which claims the benefit of U.S. Provisional Application No. 61/509,257, filed Jul. 19, 2011, entitled LIFETIME MIXED LEVEL NAND FLASH SYSTEM, the disclosures of which are hereby incorporated by reference in their entirety. Application Ser. No. 17/203,385 is also related to U.S. patent application Ser. No. 12/256,362, filed Oct. 22, 2008, entitled NONVOLATILE MEMORY SYSTEMS WITH EMBEDDED FAST READ AND WRITE MEMORIES, and U.S. patent application Ser. No. 12/915,177, filed Oct. 29, 2010, entitled NONVOLATILE MEMORY SYSTEMS WITH EMBEDDED FAST READ AND WRITE MEMORIES, the disclosures of which are hereby incorporated by reference in their entirety.

TECHNICAL FIELD

This application relates to a system and method for providing reliable storage through the use of non-volatile memories and, more particularly, to a system and method of increasing the reliability and lifetime of a NAND flash storage system, module, or chip through the use of a combination of single-level cell (SLC) and multi-level cell (MLC) NAND flash storage without substantially raising the cost of the NAND flash storage system. The memory in a total non-volatile memory system may contain some SRAM (static random-access memory), DRAM (dynamic RAM), RRAM (resistive RAM), PCM (phase change memory), MAGRAM (magnetic random-access memory), NAND flash, and one or more HDDs (hard disk drives) when storage of the order of several terabytes is required. The SLC non-volatile memory can be flash, PCM, RRAM, MAGRAM or any other solid-state non-volatile memory as long as it has endurance that is superior to that of MLC flash, and it provides for data access speeds that are faster than that of MLC flash or rotating storage media (e.g., HDDs).

BACKGROUND

Non-volatile memories provide long-term storage of data. More particularly, non-volatile memories can retain the stored data even when not powered. Magnetic (rotating) hard disk drives (HDD) dominate this storage medium due to lower cost compared to solid state disks (SSD). Optical (rotating) disks, tape drives and others have a smaller role in long-term storage systems. SSDs are preferred for their superior performance (fast access time), mechanical reliability and ruggedness, and portability. Flash memory, more specifically NAND flash, is the dominant SSD medium today.

RRAM, PCM, MAGRAM and others, will likely play a larger role in the future, each of them having their own advantages and disadvantages. They may ultimately replace flash memories, initially for use as a "write buffer" and later to replace "SLC flash" and "MLC flash." MLC NAND flash is a flash memory technology using multiple levels per cell to allow more bits to be stored using the same number of transistors. In SLC NAND flash technology, each cell can exist in one of two states, storing one bit of information per cell. Most MLC NAND flash memory has four possible states per cell, so it can store two bits of information per cell.

These semiconductor technology driven "flash alternatives," i.e., RRAM, PCM, MAGRAM and others, have several advantages over any (SLC or MLC) flash because they: 1) allow data to be written over existing data (without prior erase of existing data), 2) allow for an erase of individual bytes or pages (instead of having to erase an entire block), and 3) possess superior endurance (1,000,000 write-erase cycles compared to typical 100,000 cycles for SLC flash and less than 10,000 cycles for MLC flash).

HDDs have several platters. Each platter contains 250-5,000 tracks (concentric circles). Each track contains 64 to 256 sectors. Each sector contains 512 bytes of data and has a unique "physical (memory) address." A plurality of sectors is typically combined to form a "logical block" having a unique "logical address." This logical address is the address at which the logical block of physical sectors appears to reside from the perspective of an executing application program. The size of each logical block and its logical address (and/or address ranges/boundaries) is optimized for the particular operating system (OS) and software applications executed by the host processor. A computer OS organizes data as "files." Each file may be located (stored) in either a single logical block or a plurality of logical blocks, and therefore, the location of files typically traverses the boundaries of individual (physical) sectors. Sometimes, a plurality of files has to be combined and/or modified, which poses an enormous challenge for the memory controller device of a non-volatile memory system.

SSDs are slowly encroaching on the HDD space and the vast majority of NAND flash in enterprise servers utilizes a SLC architecture, which further comprises a NAND flash controller and a flash translation layer (FTL). NAND flash devices are generally fragmented into a number of identically sized blocks, each of which is further segmented into some number of pages. It should be noted that asymmetrical block sizes, as well as page sizes, are also acceptable within a device or a module containing devices. For example, a block may comprise 32 to 64 pages, each of which incorporates 2-4 Kbit of memory. In addition, the process of writing data to a NAND flash memory device is complicated by the fact that, during normal operation of, for example, single-level storage (SLC), erased bits (usually all bits in a block with the value of '1') can only be changed to the opposite state (usually '0') once before the entire block must be erased. Blocks can only be erased in their entirety, and, when erased, are usually written to '1' bits. However, if an erased block is already there, and if the addresses (block, page, etc.) are allowed, data can be written immediately; if not, a block has to be erased before it can be written to.

FTL is the driver that works in conjunction with an existing operating system (or, in some embedded applications, as the operating system) to make linear flash memory appear to the system like a disk drive, i.e., it emulates a HDD. This is achieved by creating "virtual" small blocks of data, or sectors, out of flash's large erase blocks and managing data on the flash so that it appears to be "write in place" when in fact it is being stored in different locations in the flash. FTL further manages the flash so that there are clean/erased places to store data.

Given the limited number of writes that individual blocks within flash devices can tolerate, wear leveling algorithms are used within the flash devices (as firmware commonly known as FTL or managed by a controller) to attempt to ensure that "hot" blocks, i.e., blocks that are frequently written, are not rendered unusable much faster than other blocks. This task is usually performed within a flash translation layer. In most cases, the controller maintains a lookup table to translate the memory array physical block address (PBA) to the logical block address (LBA) used by the host system. The controller's wear-leveling algorithm determines which physical block to use each time data is programmed, eliminating the relevance of the physical location of data and enabling data to be stored anywhere within the memory array and thus prolonging the service life of the flash memory. Depending on the wear-leveling method used, the controller typically either writes to the available erased block with the lowest erase count (dynamic wear leveling); or it selects an available target block with the lowest overall erase count, erases the block if necessary, writes new data to the block, and ensures that blocks of static data are moved when their block erase count is below a certain threshold (static wear leveling).

MLC NAND flash SSDs are slowly replacing and/or coexisting with SLC NAND flash in newer SSD systems. MLC allows a single cell to store multiple bits, and accordingly, to assume more than two values; i.e., '0' or '1'. Most MLC NAND flash architectures allow up to four (4) values per cell; i.e., '00', '01', '10', or '11'. Generally, MLC NAND flash enjoys greater density than SLC NAND flash, at the cost of a decrease in access speed and lifetime (endurance). It should be noted, however, that even SLC NAND flash has a considerably lower lifetime (endurance) than rotating magnetic media (e.g., HDDs), being able to withstand only between 50,000 and 100,000 writes, and MLC NAND flash has a much lower lifetime (endurance) than SLC NAND flash, being able to withstand only between 3,000 and 10,000 writes. As is well known in the art, any "write" or "program" to a block in NAND flash (floating gate) requires an "erase" (of a block) before "write."

Despite its limitations, there are a number of applications that lend themselves to the use of MLC flash. Generally, MLC flash is used in applications where data is read many times (but written few times) and physical size is an issue. For example, flash memory cards for use in digital cameras would be a good application of MLC flash, as MLC can provide higher density memory at lower cost than SLC memory.

When a non-volatile storage system combines HDD, SLC and MLC (setting aside volatile memory for buffering, caching etc) in a single (hybrid) system, new improvements and solutions are required to manage the methods of writing data optimally for improved life time (endurance) of flash memory. Accordingly, various embodiments of a NAND flash storage system that provides long lifetime (endurance) storage at low cost are described herein.

The following description is presented to enable one of ordinary skill in the art to make and use the disclosure and is provided in the context of a patent application and its requirements. Various modifications to the preferred embodiment and the generic principles and features described herein will be readily apparent to those skilled in the art. Thus, the present disclosure is not intended to be limited to the embodiments shown, but is to be accorded the widest scope consistent with the principles and features described herein.

SUMMARY

The present invention, as disclosed and described herein, in one aspect thereof comprises, a memory system for storing data. Memory space contains logical and physical volatile memory space and nonvolatile memory space, wherein the logical and physical nonvolatile memory space includes both multi-level cell (MLC) logical and physical nonvolatile memory space and single level cell (SLC) logical and physical nonvolatile memory space. A bank of physical nonvolatile memory includes at least one physical MLC memory module, each including at least one physical MLC nonvolatile memory element having a physical address within the physical MLC nonvolatile memory space that can be mapped to a logical address in the MLC logical nonvolatile memory space, and at least one physical SLC memory module including at least one physical SLC nonvolatile memory element having a physical address within that can be mapped into the SLC logical nonvolatile memory space. At least one random access volatile physical memory element exists in the logical volatile memory space. At least one controller operates physical memory elements and associated memory space for associated Write access operations to the physical memory elements and Read access operations from the physical memory elements, at least one read-modify-write operation where data is read from nonvolatile memory into random access memory and modified per system requirements, the controller having a controller memory associated therewith for storing received data therein. A flash translation layer (FTL), wherein the at least one controller, or the FTL, or a combination of both maintain an address table in one or more of the physical memory elements. The at least one controller controls access of the physical MLC and SLC nonvolatile memory elements and the random access volatile physical memory elements for storage of the received data therein as stored data. The controller, in at least one read-modify-write access operation transfers the stored received data from the controller memory to a given one of the physical MLC nonvolatile memory elements in an associated physical MLC memory module, operable to store the received data in the given one of the physical MLC nonvolatile memory elements as stored data and retain such received data in the random access volatile physical memory element as retained data associated with stored data. The controller performs a data integrity test on stored data in the given one of the physical MLC nonvolatile memory elements in the associated one of the physical MLC memory modules after the at least a read-modify-write access operation performed thereon by reading the stored data to the controller memory and compares the stored data in the controller memory in the given one of the physical MLC nonvolatile memory elements to the retained data that was associated with the stored data in the random access volatile physical memory element by the controller during the read-modify-write access operation. The address table maps logical addresses to physical addresses of the memory system, wherein the mapping is performed as necessitated by the memory system to maximize lifetime. A failure of the data integrity test performed on the stored data by the at least one controller results in a remapping of logical address space to a different physical range of addresses in the physical address space and transfer of data corresponding to the retained data to those remapped physical addresses in the physical address space from those physical addresses in the physical address space determined to have failed the data integrity test.

BRIEF DESCRIPTION OF THE DRAWINGS

The present disclosure will be more fully understood by reference to the following detailed description of one or more preferred embodiments when read in conjunction with the accompanying drawings, in which like reference characters refer to like parts throughout the views and in which:

FIGS. 2A and 2B are drawings depicting a translation table/address map in accordance with one embodiment of the present disclosure;

DETAILED DESCRIPTION

The present disclosure is directed to the reliable storage of data in read and write memory, and, in particular, to the reliable storage of data in non-volatile memory, such as, for example, NAND flash. Generally, and in particular regard to NAND flash memory, two separate banks of NAND flash are maintained by a controller. One bank contains economical MLC NAND flash, while a second bank contains high endurance SLC NAND flash. The controller conducts a data integrity test after every write. If a particular address range fails a data integrity test, the address range is remapped from MLC NAND flash to SLC NAND flash. As the SLC NAND flash is used to boost the lifetime (endurance) of the storage system, it can be considerably lesser in amount than the MLC NAND flash. For example, a system may set SLC NAND flash equal to 12.5% or 25% of MLC NAND flash (total non-volatile memory storage space=MLC+SLC).

Figure 1:
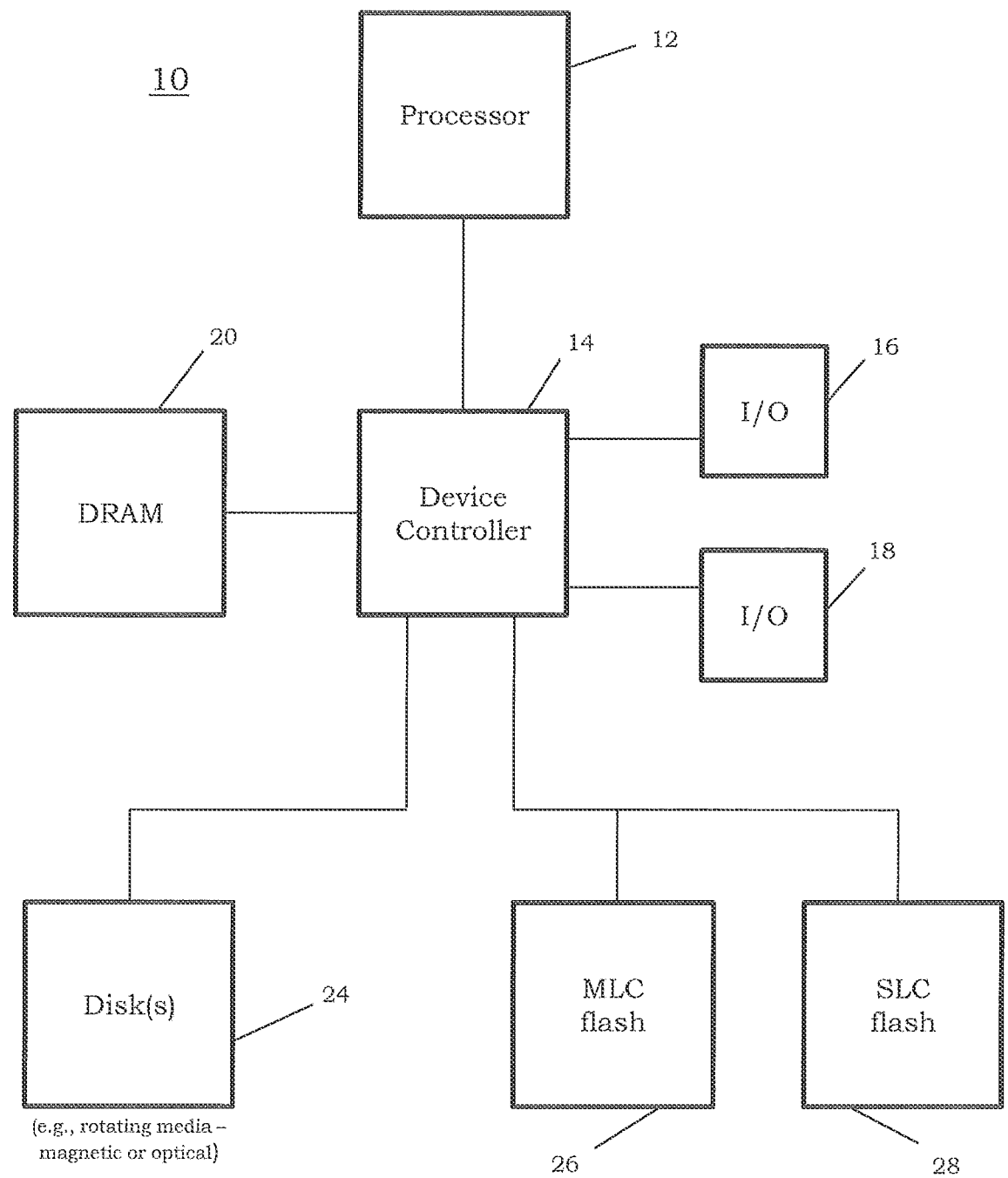
FIG. 1 is a block diagram of a computer system incorporating one embodiment of the present disclosure.

Turning to the Figures and to FIG. 1 in particular, a computer system 10 depicting one embodiment of the present disclosure is shown. A processor 12 is coupled to a device controller 14, such as a chipset, using a data link well known in the art, such as a parallel bus or packet-based link. The device controller 14 provides interface functions to the processor 12. In some computer systems, the device controller 14 may be an integral part of the (host) processor 12. The device controller 14 provides a number of input/output ports 16 and 18, such as, for example, serial ports (e.g., USB ports and Firewire ports) and network ports (e.g., Ethernet ports and 802.11 "Wi-Fi" ports). The device controller 14 may also control a bank of, for example, DRAM 20. In addition, the device controller 14 controls access to one or more disks 24, such as, for example, a rotating magnetic disk, or an optical disk, as well as two or more types of NAND flash memory. One type of NAND flash memory is a MLC NAND flash memory module 26. Another type of NAND flash memory is a SLC NAND flash memory module 28.

The device controller 14 maintains a translation table/address map which may include address translations for all devices in the computer system. Nonetheless, the discussion in the present disclosure will be limited only to NAND flash memory modules. In particular, the device controller 14 maintains a translation table that maps logical computer system addresses to physical addresses in each one of the MLC- and SLC-NAND flash memory modules 26 and 28, respectively. As MLC flash memory is less expensive than SLC flash memory, on a cost per bit basis, the translation table will initially map all logical NAND flash addresses to the MLC NAND flash memory module 26. The address ranges within the translation table will assume some minimum quantum, such as, for example, one block, although a smaller size, such as one page could be used, if the NAND flash has the capability of erasing the smaller size quantum.

A "read-modify-write" scheme is used to write data to the NAND flash. Data to be written to NAND flash is maintained in DRAM 20. After each write to an address within a particular address range, the device controller 14 will—as time permits—perform a read on the address range to ensure the integrity of the written data. If a data integrity test fails, the address range is remapped from the MLC NAND flash memory module 26 to the next available address range in the SLC NAND flash memory module 28.

FIGS. 2A and 2B illustrate one embodiment of a translation table/address map of the present disclosure. In FIG. 2A, a list of logical address ranges (R0-RN) is translated to physical address ranges. As illustrated, all of the logical address ranges are translated to blocks on the MLC NAND flash memory module 26. However, through the application of a data integrity verification check (explained in more detail below) it is determined that, for example, address range R2 corresponds to failed quanta of data stored in block 2 of the MLC NAND flash memory module 26. FIG. 2B shows the quanta of data which failed the data integrity verification check (see FIG. 2A) remapped to the next available range of physical addresses within the SLC NAND flash memory module 28, in this example, SLC/block 0.

Figure 3A:
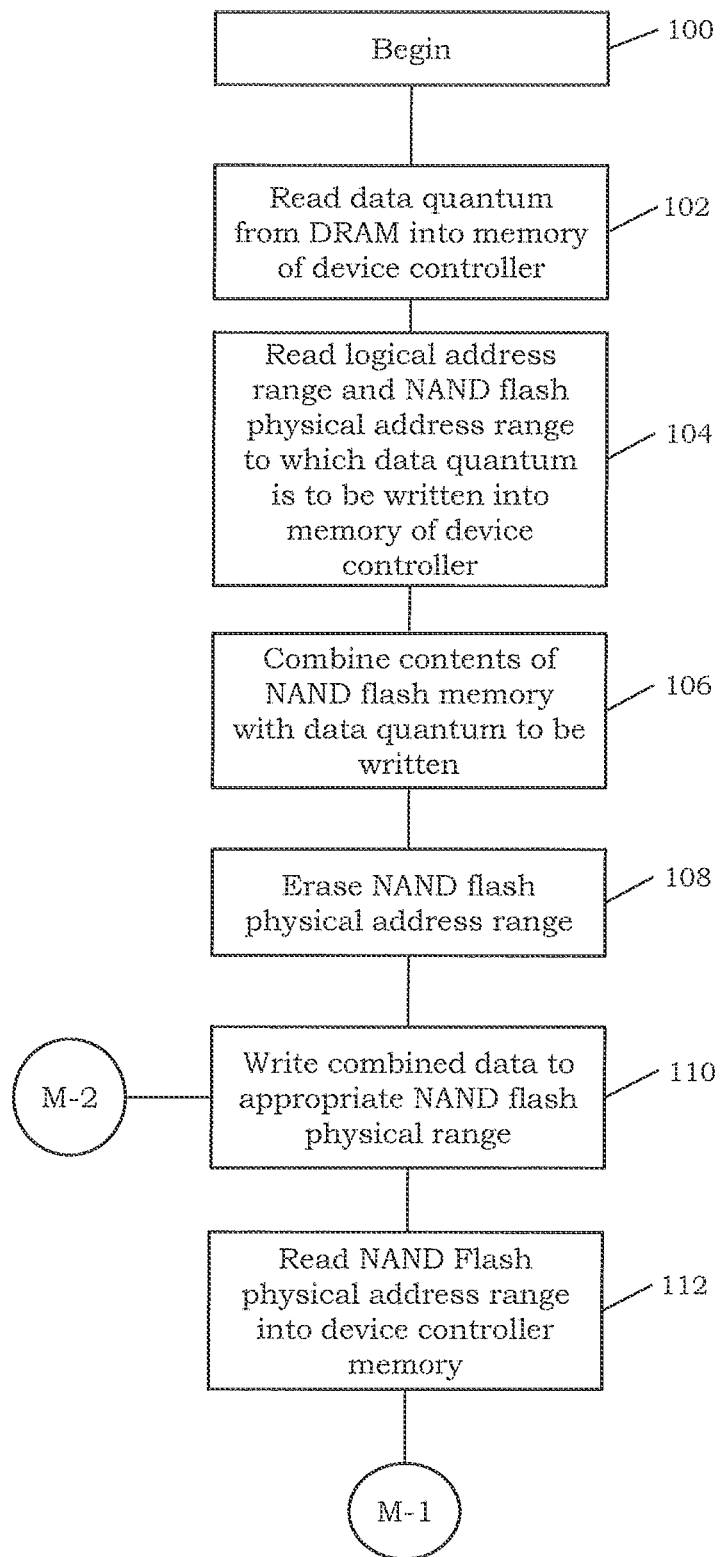
FIGS. 3A and 3B are a flow chart illustrating an exemplary method for use in implementing one embodiment of the present disclosure.
Figure 3B:
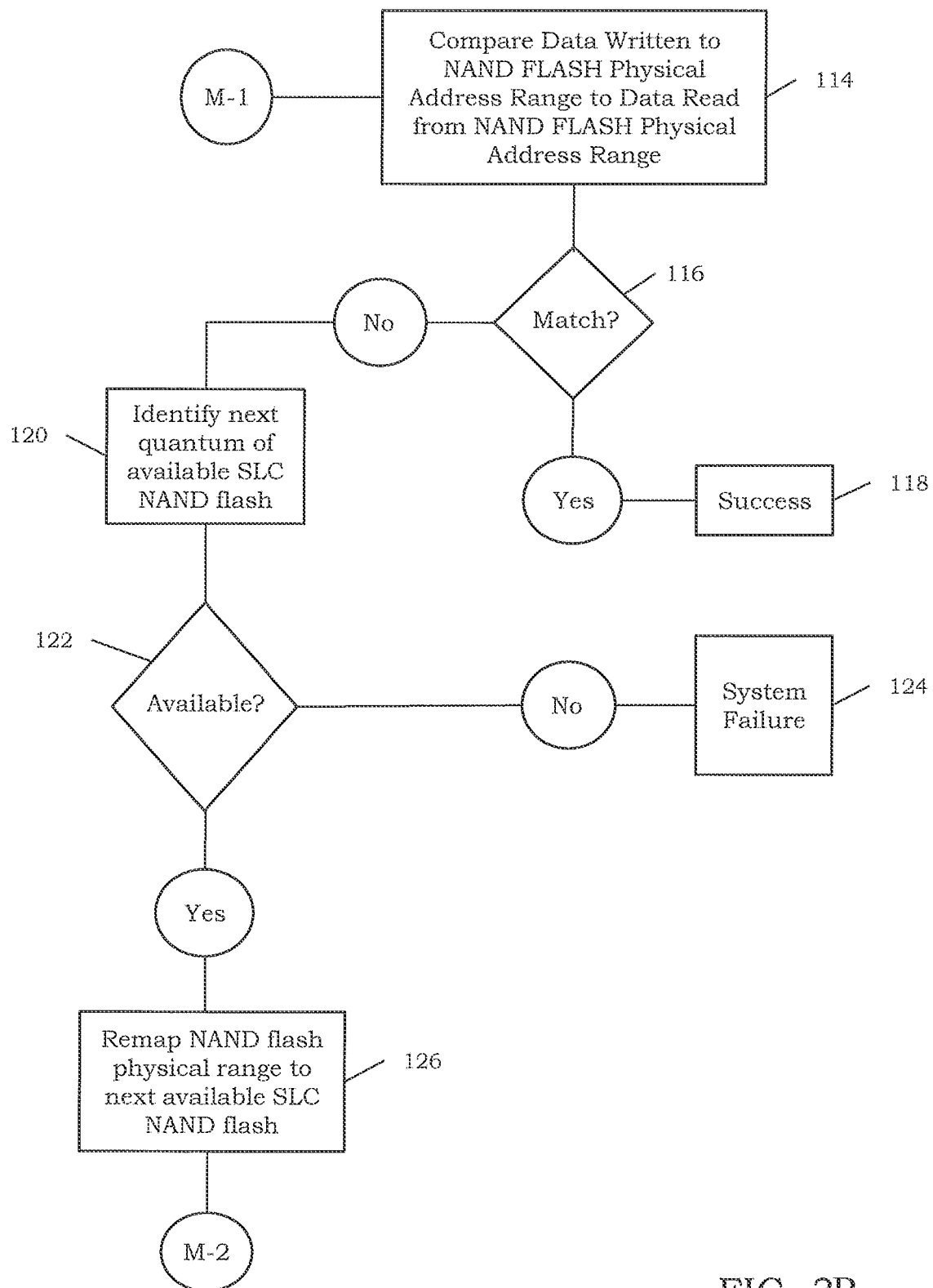

FIGS. 3A and 3B are a flow chart illustrating a method for utilizing a NAND flash memory system incorporating one embodiment of the present disclosure. The method begins in a step 100, when a command to write a quantum of data stored in DRAM to a particular location in NAND flash memory is received. In step 102, the quantum of data is read from DRAM into memory within the device controller (which acts as the memory controller). In step 104, both the logical address range and the NAND flash physical address range to which the quantum of data is to be written, is read into memory of the device controller. In step 106, the quantum of data to be written is combined with the contents of the NAND flash memory. In step 108, the NAND flash physical address range to be written is erased. In step 110, the combined data is written to the appropriate NAND flash physical address range. In step 112 the NAND flash physical address range that was written in step 110 is read into device controller memory.

The flowchart continues in FIG. 3B. In step 114 the NAND flash physical address range that was read into device controller memory is compared with the retained data representing the combination of the previous contents of the physical address range and the quantum of data to be written. In step 116, if the retained data matches the newly stored data in the NAND flash memory, the write was a success, and the method exits in step 118. However, if the retained data does not match the newly stored data in the NAND flash memory, the method executes step 120, which identifies the next quantum of available SLC NAND flash memory addresses. In step 122, a check is made to determine if additional SLC NAND flash memory is available, and, if not, the NAND flash memory system is marked as failed, prompting a system alert step 124. However, if additional SLC NAND flash memory is available, the failed NAND flash physical address range is remapped to the next available quantum of SLC NAND flash memory in step 126. Execution then returns to step 110, where the write is repeated.

Another application of one embodiment of the present disclosure, not depicted in any of the drawings, is to allocate "hot" blocks; i.e., those blocks that receive frequent writes, into the SLC NAND flash memory module 28, while allocating "cold" blocks; i.e., those blocks that only receive infrequent writes, into the MLC NAND flash memory module 26. This could be accomplished within the device controller 14 described above, which could simply maintain a count of those blocks that are accessed (written to) most frequently, and, on a periodic basis, such as, for example, every 1000 writes, or every 10,000 writes, transfer the contents of those blocks into the SLC NAND flash memory module 28.

Figure 4:
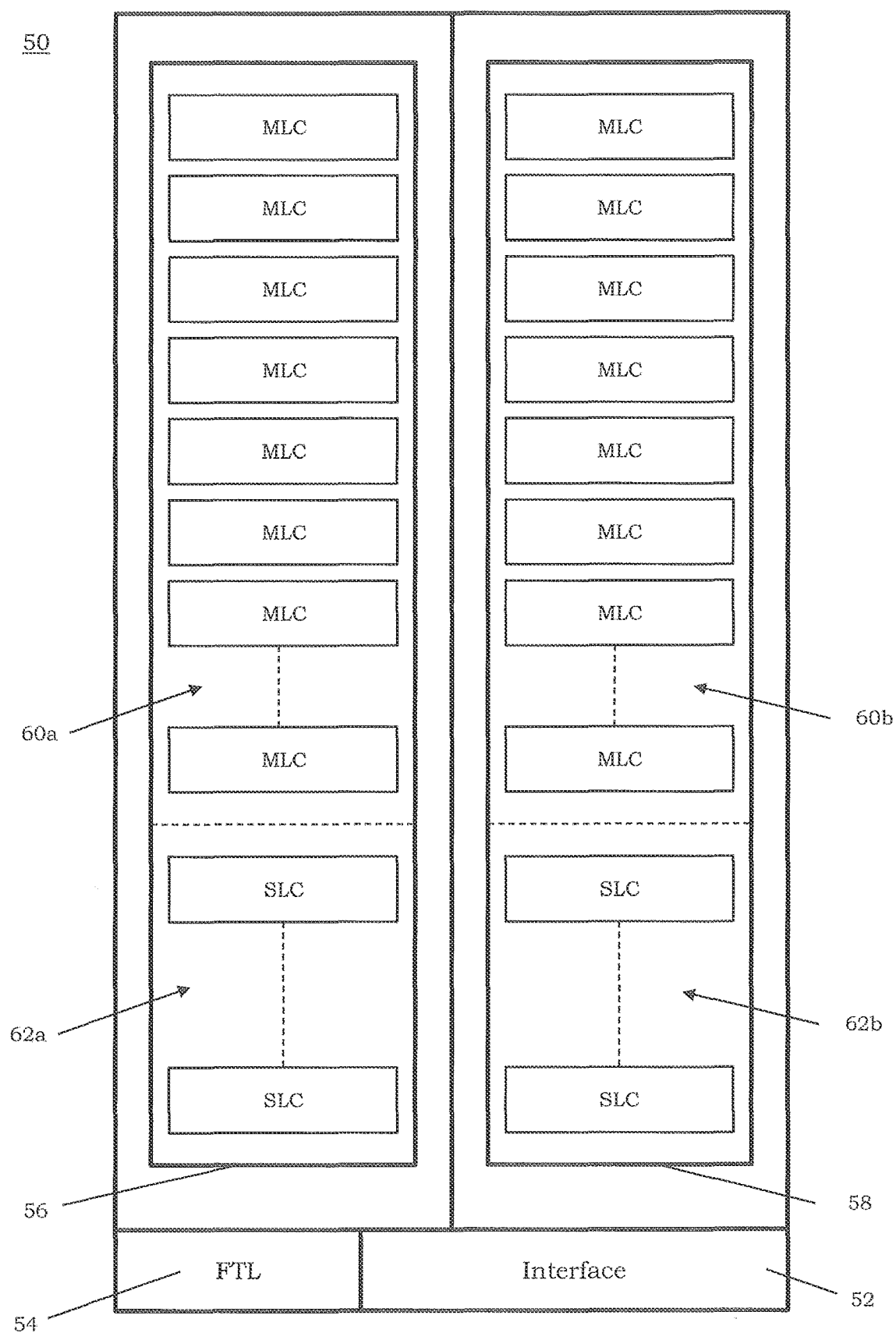
FIG. 4 is a block diagram depicting one embodiment of the present disclosure for implementation within a NAND flash module.

FIG. 4 depicts another embodiment of the present disclosure. The embodiment is entirely resident within a NAND flash module 50. In particular, a standard NAND flash interface 52 is managed by flash translation layer (FTL) logic 54. The flash translation layer (FTL) 54 manages two NAND flash memory banks 56 and 58, whereby memory bank 56 comprises a plurality of MLC NAND flash memory modules 60a and a plurality of SLC NAND flash memory modules 62a. Memory bank 58 comprises a plurality of MLC NAND flash memory modules 60b and a plurality of SLC NAND flash memory modules 62b.

This embodiment of the present disclosure could function similarly to the system level embodiment discussed earlier with reference to FIGS. 1-3B, but the control functions, such as maintenance of the translation table/address map (FIGS. 2A and 2B), could be conducted within the flash translation layer (FTL) 54 instead of in a device controller 14.

Embodiments of the present disclosure relate to a system and method of increasing the reliability and lifetime of a NAND flash storage system, module, or chip through the use of a combination of multi-level cell (MLC) and single-level cell (SLC) NAND flash storage. The above description is presented to enable one of ordinary skill in the art to make and use the disclosure and is provided in the context of a patent application and its requirements. While this disclosure contains descriptions with reference to certain illustrative aspects, it will be understood that these descriptions shall not be construed in a limiting sense. Rather, various changes and modifications can be made to the illustrative embodiments without departing from the true spirit, central characteristics and scope of the disclosure, including those combinations of features that are individually disclosed or claimed herein. Furthermore, it will be appreciated that any such changes and modifications will be recognized by those skilled in the art as an equivalent to one or more elements of the following claims, and shall be covered by such claims to the fullest extent permitted by law.

What is claimed is:

1. A memory system for storing data comprising:
memory space containing logical and physical volatile memory space and nonvolatile memory space, wherein the logical and physical nonvolatile memory space includes both multi-level cell (MLC) logical and physical nonvolatile memory space and single level cell (SLC) logical and physical nonvolatile memory space;
a bank of physical nonvolatile memory, including:
at least one physical MLC memory module, each including at least one physical MLC nonvolatile memory element having a physical address within the physical MLC nonvolatile memory space that can be mapped to a logical address in the MLC logical nonvolatile memory space, and
at least one physical SLC memory module including at least one physical SLC nonvolatile memory element having a physical address within that can be mapped into the SLC logical nonvolatile memory space;
at least one random access volatile physical memory element that exists in the logical volatile memory space;
at least one controller to operate physical memory elements and associated memory space for associated Write access operations to the physical memory elements and Read access operations from the physical memory elements, at least one read-modify-write operation where data is read from nonvolatile memory into random access memory and modified per system requirements, the controller having a controller memory associated therewith for storing received data therein;
a flash translation layer (FTL), wherein the at least one controller, or the FTL, or a combination of both maintain an address table in one or more of the physical memory elements;
the at least one controller controlling access of the physical MLC and SLC nonvolatile memory elements and the random access volatile physical memory elements for storage of the received data therein as stored data, the controller, in at least one read-modify-write access operation transferring the stored received data from the controller memory to a given one of the physical MLC nonvolatile memory elements in an associated physical MLC memory module, operable to store the received data in the given one of the physical MLC nonvolatile memory elements as stored data and retain such received data in the random access volatile physical memory element as retained data associated with stored data;
the at least one controller performing a data integrity test on stored data in the given one of the physical MLC nonvolatile memory elements in the associated one of the physical MLC memory modules after the at least a read-modify-write access operation performed thereon by reading the stored data to the controller memory and comparing the stored data in the controller memory in the given one of the physical MLC nonvolatile memory elements to the retained data that was associated with the stored data in the random access volatile physical memory element by the controller during the read-modify-write access operation;
wherein the address table maps logical addresses to physical addresses of the memory system, wherein the mapping is performed as necessitated by the memory system to maximize lifetime; and
wherein a failure of the data integrity test performed on the stored data by the at least one controller results in a remapping of logical address space to a different physical range of addresses in a physical address space and transfer of data corresponding to the retained data to those remapped physical addresses in the physical address space from those physical addresses in the physical address space determined to have failed the data integrity test.

2. The memory system of claim 1, wherein the FTL is a software module, or a firmware module containing software updates.

3. The memory system of claim 1, wherein at least one of the random access volatile physical memory element or the MLC and SLC nonvolatile memory elements are embedded in the at least one controller.

4. The memory system of claim 1, wherein the physical MLC and SLC nonvolatile memory elements comprise flash memory.

5. The memory system of claim 1, wherein the random access volatile physical memory element is dynamic random access memory.

6. The memory system of claim 1, wherein the random access volatile physical memory element is static random access memory.

7. The memory system of claim 1, wherein the at least one physical SLC nonvolatile memory element includes a hard disk drive (HDD).

8. The memory system of claim 1, wherein the at least one controller is associated with a processor external to the memory system.

9. The memory system of claim 1, wherein the remapped physical addresses in the physical address space are located in the SLC memory module.

10. The memory system of claim 1, wherein the FTL is associated with the MLC memory modules and the SLC memory modules in the bank of physical nonvolatile memory.

11. The memory system of claim 1, wherein the at least one physical MLC nonvolatile memory element and the at least one physical SLC nonvolatile memory element comprise integrated circuits.

12. The memory system of claim 1, wherein the at least one physical MLC nonvolatile memory element and the at least one physical SLC nonvolatile memory element comprises a pages.

13. The memory system of claim 1, wherein the MLC memory modules and SLC memory modules further comprise a plurality of physical MLC nonvolatile memory elements and physical SLC nonvolatile memory elements.

14. The memory system of claim 1, wherein the bank of physical nonvolatile memory further includes a plurality of physical MLC memory modules and a plurality of physical SLC memory modules.

\* \* \* \* \*